(12) United States Patent
Hyun et al.

(10) Patent No.: US 9,412,802 B2
(45) Date of Patent: Aug. 9, 2016

(54) ORGANIC LIGHT EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Chae-Han Hyun, Yongin (KR); Seung-Kyu Lee, Yongin (KR); Jin Jeon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/256,234

(22) Filed: Apr. 18, 2014

(65) Prior Publication Data

US 2015/0090966 A1    Apr. 2, 2015

(30) Foreign Application Priority Data

Oct. 2, 2013 (KR) .................. 10-2013-0118126

(51) Int. Cl.
   *H01L 27/32*    (2006.01)

(52) U.S. Cl.
   CPC ......... *H01L 27/3276* (2013.01); *H01L 27/3246* (2013.01)

(58) Field of Classification Search
   CPC ............ H01L 27/3244; H01L 51/5228; H01L 51/5218; H01L 27/3246; H01L 27/3276; H01L 2251/5315; H01L 51/5234; H01L 51/5284; H01L 27/3279
   USPC ............ 257/88, 40, 59, 79, 83; 313/504, 509, 313/506, 503
   See application file for complete search history.

(56) References Cited

U.S. PATENT DOCUMENTS

| | | | |
|---|---|---|---|
| 7,068,247 B2 | 6/2006 | Nakanishi | |
| 7,629,617 B2 | 12/2009 | Yamazaki et al. | |
| 7,928,654 B2 | 4/2011 | Tsuchiya et al. | |
| 8,026,667 B2 | 9/2011 | Kwak et al. | |
| 8,227,808 B2 | 7/2012 | Wan et al. | |
| 8,247,968 B2 | 8/2012 | Kwak et al. | |
| 8,344,616 B2 | 1/2013 | Sim et al. | |
| 2003/0122495 A1 | 7/2003 | Nakanishi | |
| 2004/0160170 A1* | 8/2004 | Sato et al. | 313/504 |

(Continued)

FOREIGN PATENT DOCUMENTS

| | | | |
|---|---|---|---|
| JP | 2003-241685 A | 8/2003 | |
| JP | 4515022 B2 | 5/2010 | |

(Continued)

*Primary Examiner* — David Vu
*Assistant Examiner* — Mouloucoulaye Inoussa
(74) *Attorney, Agent, or Firm* — Robert E. Bushnell, Esq.

(57) ABSTRACT

Provided are an organic light emitting display apparatus and a method of manufacturing the same. The apparatus includes a substrate including a display area and a peripheral area outside the display area, a plurality of thin film transistors (TFTs) disposed in the peripheral area of the substrate, a first insulating layer covering the plurality of TFTs, a plurality of conductive layers disposed on the first insulating layer to be located above the plurality of TFTs and to be mutually separated to correspond to spaces among the plurality of TFTs, a second insulating layer covering spaces among the plurality of conductive layers, and an opposite electrode corresponding to the display area and the peripheral area of the substrate, covering the second insulating layer, and being in contact with at least portions of the conductive layers.

11 Claims, 5 Drawing Sheets

(56) References Cited

U.S. PATENT DOCUMENTS

| | | | |
|---|---|---|---|
| 2005/0200270 A1* | 9/2005 | Kwak | H01L 27/3276 313/502 |
| 2007/0034875 A1 | 2/2007 | Yamazaki et al. | |
| 2008/0123008 A1* | 5/2008 | Yoshii | 349/44 |
| 2011/0063267 A1 | 3/2011 | Sim et al. | |
| 2011/0298391 A1 | 12/2011 | Kwak et al. | |
| 2013/0215092 A1 | 8/2013 | Wu et al. | |

FOREIGN PATENT DOCUMENTS

| | | |
|---|---|---|
| KR | 1020050090586 A | 9/2005 |
| KR | 1020070094263 A | 9/2007 |
| KR | 10-1258259 B1 | 4/2013 |

\* cited by examiner

ORGANIC LIGHT EMITTING DISPLAY APPARATUS AND METHOD OF MANUFACTURING THE SAME

CLAIM OR PRIORITY

This application claims priority under 35 U.S.C. §119 of Korean Patent Application No. 10-2013-0118126, filed on Oct. 2, 2013, in the Korean Intellectual Property Office, the disclosure of which is incorporated herein in its entirety by reference.

BACKGROUND OF THE INVENTION

1. Field of the Invention

One or more embodiments of the present invention relate to an organic light emitting display apparatus and a method of manufacturing the same, and more particularly, to an organic light emitting display apparatus capable of preventing a damage of a driving unit, caused by heat generation, and a method of manufacturing the apparatus.

2. Description of the Related Art

Among display apparatuses, organic light emitting display apparatuses not only have wide viewing angles and excellent contrasts but also rapidly respond, which attract attentions as next generation display apparatuses.

Generally, an organic light emitting display apparatus includes organic light emitting devices (OLEDs) including a thin film transistor on a substrate. Here, an area, in which OLEDs are formed, becomes a display area of the organic light emitting display apparatus. Outside the display area, a peripheral area including a thin film transistor is formed. In this case, in the peripheral area of the organic light emitting display apparatus, an outgassing hole is formed for outgassing and an insulating layer covering the outgassing hole is disposed.

However, in general organic light emitting display apparatuses and general methods of manufacturing the same, a thin film transistor in a peripheral area is damaged by heat generated by a contact resistance of a portion of the peripheral area, on which a pixel electrode and an opposite electrode are in contact with each other.

SUMMARY OF THE INVENTION

One or more embodiments of the present invention include an organic light emitting display apparatus capable of preventing a damage of a peripheral unit, caused by a heat generation, and a method of manufacturing the apparatus.

Additional aspects will be set forth in part in the description which follows and, in part, will be apparent from the description, or may be learned by practice of the presented embodiments.

According to one or more embodiments of the present invention, an organic light emitting display apparatus includes a substrate including a display area and a peripheral area outside the display area, a plurality of thin film transistors (TFTs) disposed in the peripheral area of the substrate, a first insulating layer covering the plurality of TFTs, a plurality of conductive layers disposed on the first insulating layer to be located above the plurality of TFTs and to be mutually separated to correspond to spaces among the plurality of TFTs, a second insulating layer covering spaces among the plurality of conductive layers, and an opposite electrode corresponding to the display area and the peripheral area of the substrate, covering the second insulating layer, and being in contact with at least portions of the conductive layers.

In a direction perpendicular to a major surface of the substrate on which the plurality of TFTs are disposed, an interval between two immediately adjacent TFTs may overlap with one of the plurality of conductive layers.

In the direction perpendicular to the major surface of the substrate, the interval between the two immediately adjacent TFTs may overlap with a portion of the one of the plurality of conductive layers where the opposite electrode and the one of the plurality of conductive layers directly contact with each other.

In a direction perpendicular to a major surface of the substrate on which the plurality of TFTs are disposed, portions of the plurality of the conductive layers, where the opposite electrode and the plurality of conductive layers directly contact with each other, may not overlap with any gates of the plurality of TFTs.

In a direction perpendicular to a major surface of the substrate on which the plurality of TFTs are disposed, portions of the plurality of conductive layers, where the opposite electrode and the plurality of conductive layers directly contact with each other, may not overlap with any of the plurality of TFTs.

Each of the plurality of TFTs may include a semiconductor layer, a gate electrode, a source electrode, and a drain electrode, and the second insulating layer may be disposed to correspond to the semiconductor layer.

The second insulating layer may expose a portion of each of the plurality of conductive layers.

The opposite electrode may be in contact with the portion of each of the plurality of conductive layers, the portion being exposed by the second insulating layer.

The first insulating layer may be located throughout the display area and the peripheral area of the substrate. The apparatus may further include a plurality of pixel electrodes located on the first insulating layer in the display area and an intermediate layer including an emission layer, on the plurality of pixel electrodes. The opposite electrode may correspond to the plurality of pixel electrodes, and the plurality of conductive layers may include same material as the pixel electrodes.

The apparatus may further include a pixel definition layer covering an edge of each of the plurality of pixel electrodes to expose a central portion of each of the plurality of pixel electrodes. The second insulating layer may be formed as a single body together with the pixel definition layer.

According to one or more embodiments of the present invention, a method of manufacturing an organic light emitting display apparatus includes preparing a substrate including a display area and a peripheral area outside the display area, forming a plurality of TFTs in the peripheral area of the substrate, forming a first insulating layer to cover the plurality of TFTs, forming a plurality of conductive layers on the first insulating layer to be located above the plurality of TFTs and to be mutually separated to correspond to spaces among the plurality of TFTs, forming a second insulating layer to cover spaces among the plurality of conductive layers, and forming an opposite electrode to correspond to the display area and the peripheral area of the substrate, to cover the second insulating layer, and to be in contact with at least portions of the conductive layers.

The forming of the plurality of TFTs may include forming a semiconductor layer, forming a gate electrode and forming a source electrode and a drain electrode. The second insulating layer may be formed to correspond to the semiconductor layer.

The forming of the second insulating layer may include exposing a portion of each of the plurality of conductive layers.

The forming of the opposite electrode may include forming the opposite electrode to be in contact with the portion of each of the plurality of conductive layers, the portion being exposed by the second insulating layer.

The forming of the first insulating layer may include forming the first insulating layer to be located throughout the display area and the peripheral area of the substrate. The method may further include forming a plurality of pixel electrodes located on the first insulating layer in the display area and forming an intermediate layer including an emission layer, on the plurality of pixel electrodes. The forming of the opposite electrode may include forming the opposite electrode to correspond to the plurality of pixel electrodes, and the forming the plurality of conductive layers may be performed simultaneously with the forming the pixel electrodes.

The method may further include forming a pixel definition layer to cover an edge of each of the plurality of pixel electrodes to expose a central portion of each of the plurality of pixel electrodes. The forming the second insulating layer may be performed simultaneously with the forming the pixel definition layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
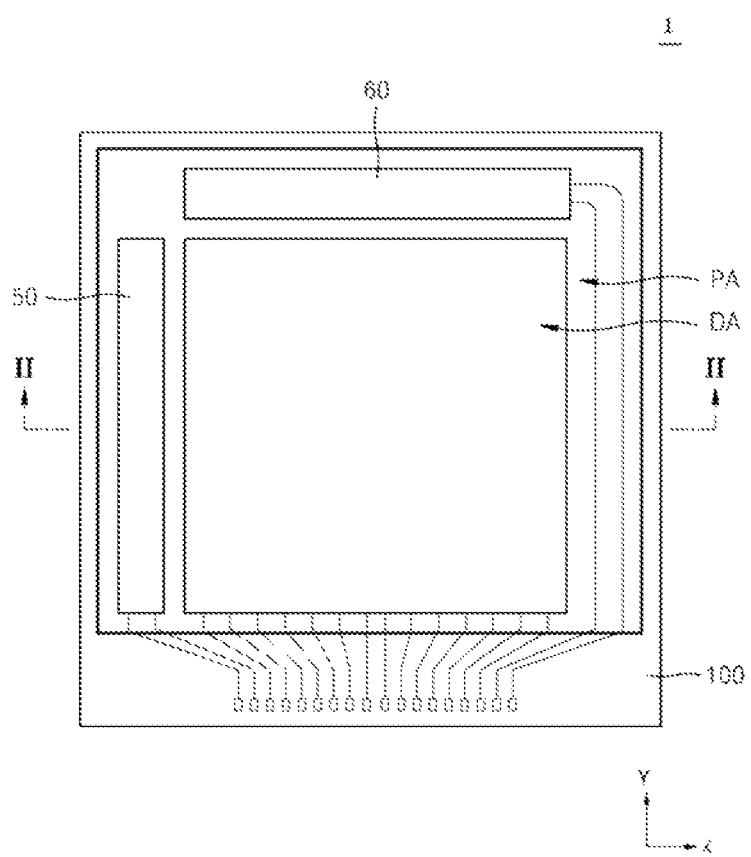
FIG. 1 is a schematic top view illustrating an organic light emitting display apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Hereinafter, embodiments of the present invention will be described in detail with reference to the attached drawings. However, since the present invention is not limited to the embodiments disclosed below but may be embodied as various different shapes, the embodiments below are provided to fully disclose the present invention and to allow a person with ordinary skill to consummately know the scope of the present invention. Also, for convenience of description, in the drawings, sizes of elements may be exaggerated or contracted. For example, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

On the other hand, it will be understood that when a layer, region, or component is referred to as being "formed on" another layer, region, or component, it can be directly or indirectly formed on the other layer, region, or component. That is, for example, intervening layers, regions, or components may be present.

Figure 2:
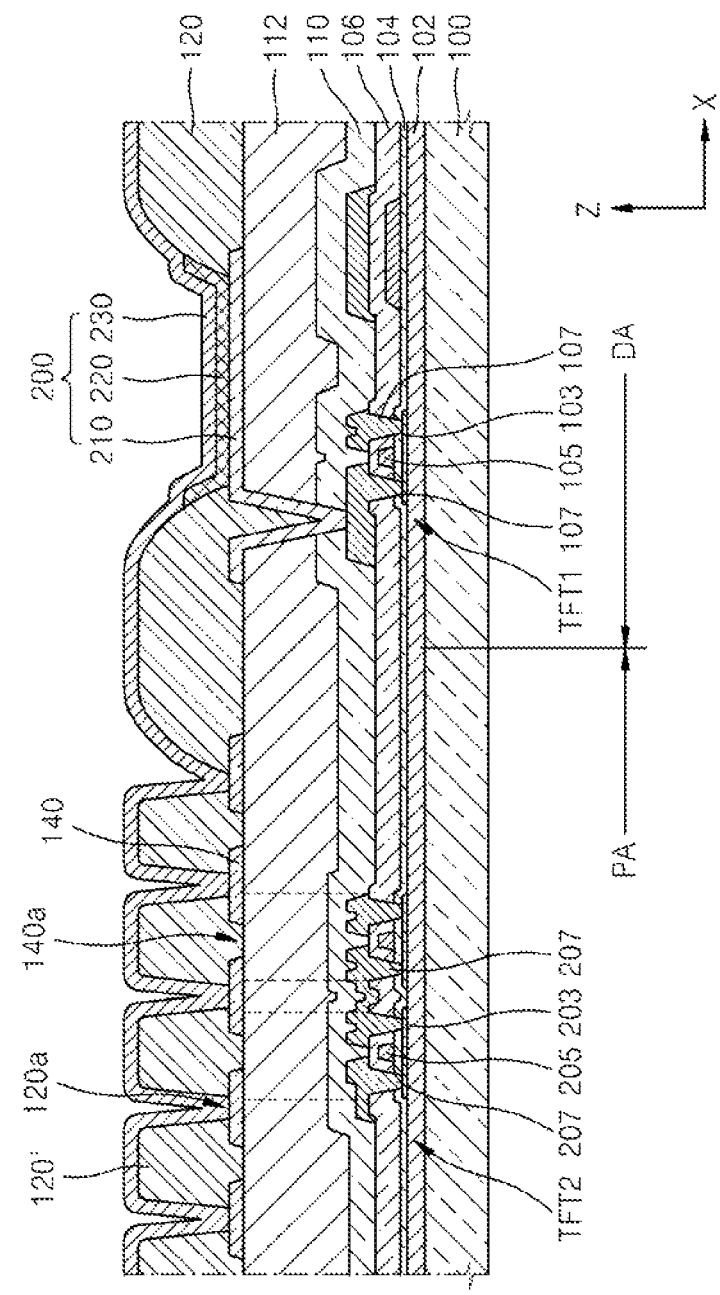
FIG. 2 is a cross-sectional view illustrating a part taken along a line II-II of FIG. 1.

FIG. 1 is a schematic top view illustrating an organic light emitting display apparatus 1 according to an embodiment of the present invention, and FIG. 2 is a cross-sectional view illustrating a part taken along a line II-II of FIG. 1. As shown in FIG. 1, the apparatus 1 may include, on a substrate 100, a certain display area DA including a plurality of organic light emitting devices (OLEDs) 200 and a peripheral area PA outside the display area DA. In the peripheral area PA located outside the display area DA, a vertical circuit unit 50 and a horizontal circuit unit 60 inputting signals to thin film transistors TFT1 of the display area DA are further provided, which may be connected to a terminal area by a circuit wiring unit.

FIG. 2 illustrates the part taken along the line II-II of the apparatus 1. As shown in FIG. 2, the apparatus 1 includes the substrate 100 having the display area DA and the peripheral area PA, a plurality of thin film transistors TFT2 disposed in the peripheral area PA of the substrate 100, a first insulating layer 112 covering the plurality of thin film transistors TFT2, a plurality of conductive layers 140 located on the first insulating layer 112, and a second insulating layer 120' disposed between the plurality of conductive layers 140. Although only two thin film transistors TFT2 are shown in FIG. 2 along the line II-II illustrated in FIG. 1, the apparatus 1 according to the present embodiment may include three or more thin film transistors TFT2 along the line II-II.

The substrate 100 has the display area DA and the peripheral area PA outside the display area DA. The substrate 100 may be formed of various materials such as glass, metal, and plastic. The display area DA is an area in which the OLEDs are disposed. The peripheral area PA outside the display area DA is a dead space in which displaying is not performed. In other words, no OLED may be formed in the peripheral area. A peripheral unit applying electric signals to the display area DA may be located in the peripheral area PA. In detail, the peripheral area PA, as shown in FIG. 1, may include the vertical circuit unit 50, the horizontal circuit unit 60, a control unit (not shown), and a power supply unit (not shown). In the apparatus 1, an image signal is received from the peripheral unit located in the peripheral area PA and the respective display unit may display the image signals received from different image signal input units. In this case, the vertical circuit unit 50 may be considered as a scan driver and the horizontal circuit unit 60 may be considered as a data driver.

In both the display area DA and the peripheral area PA outside the display area DA on the substrate 100, the plurality of thin film transistors TFT1 and TFT2 may be disposed. The thin film transistors TFT1 of the display area DA may be electrically connected to a pixel electrode 210 disposed in the display area DA through a via hole. The OLEDs 200 being electrically connected to the plurality of thin film transistors TFT1 may be considered as a plurality of pixel electrodes 210 being electrically connected to the plurality of thin film transistors TFT1. In the peripheral area PA outside the display area DA, the plurality of thin film transistors TFT2 may be disposed. The thin film transistors TFT2 may be a part of the peripheral unit to control electric signals applied into the display area DA. In FIG. 2, the thin film transistors TFT2 may be the thin film transistors TFT2 disposed in the vertical circuit unit 50.

Each of the thin film transistors TFT1 disposed in the display area DA may include a semiconductor layer 103 formed of amorphous silicon, polycrystalline silicon, or organic semiconductor material, a gate electrode 105, and source/drain electrodes 107. Similarly, each of the thin film transistors TFT2 disposed in the peripheral area PA may include a semiconductor layer 203 formed of amorphous silicon, polycrystalline silicon, or organic semiconductor material, a gate electrode 205, and source/drain electrodes 207. In order to planarize a surface of the substrate 100 or to prevent impurities from permeating into the semiconductor layers 103 and 203, a buffer layer 102 formed of silicon oxides or silicon nitrides is disposed on the substrate 100 and the semiconductor layers 103 and 203 may be allowed to be located on the buffer layer 102.

The gate electrodes 105 and 205 are disposed on the semiconductor layers 103 and 203. According to signals applied to the gate electrodes 105 and 205, the source/drain electrodes 107 and 207 are electrically connected. Considering adhesion between adjacent layers, surface evenness of deposited layers, and processability, the gate electrodes 105 and 205 may be formed of a single or multiple stacked layer by using one or more materials of aluminum Al, platinum Pt, palladium Pd, silver Ag, magnesium Mg, gold Au, Nickel Ni, neodymium Nd, iridium Ir, chrome Cr, lithium Li, calcium Ca, molybdenum Mo, titanium Ti, tungsten W, and copper Cu. In this case, in order to provide insulation between the semiconductor layers 103 and 203 and the gate electrodes 105 and 205, a gate insulating layer 104 formed of silicon oxides and/or silicon nitrides may be disposed between the semiconductor layers 103 and 203 and the gate electrodes 105 and 205.

An interlayer dielectric 106 may be disposed above the gate electrodes 105 and 205 and may be formed as a single layer or a multiple stacked layer formed of silicon oxides or silicon nitrides.

The source/drain electrodes 107 and 207 are disposed above the interlayer dielectric 106. The source/drain electrodes 207 of adjacent thin film transistors TFT2 shown in FIG. 2 are connected, but may be separated from each other. The source/drain electrodes 107 and 207 are electrically connected the semiconductor layers 103 and 203 via contact holes formed in the interlayer dielectric 106 and the gate insulating layer 104, respectively. The gate electrodes 107 and 207, considering conductivity, may be formed of a single or multiple stacked layer by using one or more materials of aluminum Al, platinum Pt, palladium Pd, silver Ag, magnesium Mg, gold Au, Nickel Ni, neodymium Nd, iridium Ir, chrome Cr, lithium Li, calcium Ca, molybdenum Mo, titanium Ti, tungsten W, and copper Cu.

In order to protect the thin film transistors TFT1 and/or the thin film transistors TFT2 having such structures, a protection layer 110 may be disposed to cover the thin film transistors TFT1 and/or the thin film transistors TFT2. The protection layer 110 may be formed of an inorganic material such as silicon oxides, silicon nitrides, and silicon oxynitrides. The protection layer 110 is shown in FIG. 1 as a single layer but may have a multilayer structure.

The first insulating layer 112 may be disposed on the protection layer 110 if necessary. In this case, the first insulating layer 112 may be a planarization layer or another protection layer. The first insulating layer 112 may be located throughout the display area DA and the peripheral area PA of the substrate 100. For example, as shown in the drawing, when the OLED 200 is disposed above the thin film transistors TFT1 of the display area DA of the substrate 100, the first insulating layer 112 may be disposed as a planarization layer for generally planarizing a top surface of the protection layer 110 covering the thin film transistors TFT1. The first insulating layer 112 may be formed of, for example, one of an acrylic organic material and benzocyclobutene (BCB). The first insulating layer 112 is shown in FIG. 1 as a single layer but may have a multilayer structure and may be variously modified.

In the peripheral area PA outside the display area DA of the substrate 100, the plurality of conductive layers 140 may be located on the first insulating layer 112. The plurality of conductive layers 140 may be disposed on the first insulating layer 112 to be located above the plurality of thin film transistors TFT2, and in more detail, may be disposed on the first insulating layer 112 to be separated from one another to correspond to a space between the plurality of thin film transistors TFT2. For example, in a direction perpendicular (Z direction) to a major surface, on which the plurality of thin film transistors TFT1 and TFT2 are formed, of the substrate 100, an interval between two immediately adjacent thin film transistors TFT2 may overlap with one of the plurality of conductive layers 140. A reason of disposing the plurality of conductive layers 140 on the first insulating layer 112 to be separated from one another may be understood to allow a lower organic layer to be outgassable.

The plurality of conductive layers 140 may include same material as the pixel electrode 210. That is, the plurality of conductive layers 140 may be formed simultaneously with forming the pixel electrode 210 on the display area DA.

In the display area DA of the substrate 100, on the first insulating layer 112, there is disposed the OLED 200 including the pixel electrode 210, the opposite electrode 230, and an intermediate layer 220 including an emission layer and disposed therebetween.

There is an opening in the protection layer 110 and the first insulating layer 112. The opening exposes at least one of the source/drain electrodes 107 of the thin film transistor TFT1. The pixel electrode 210 in contact with any one of the source/drain electrodes 107 through the opening and electrically connected to the thin film transistor TFT1 is disposed on the first insulating layer 112. The pixel electrode 210 may be formed as one of a semitransparent electrode and a reflective electrode. When being formed as the semitransparent electrode, the pixel electrode 210 may be formed of one of ITO, IZO, ZnO, $In_2O_3$, IGO, and AZO. When being formed as the reflective electrode, the pixel electrode 210 may have a reflective layer formed of one of Ag, Mg, Al, Pt, Pd, Au, Ni, Nd, Ir, Cr, and a compound thereof and a layer formed of ITO, IZO, ZnO, $In_2O_3$, IGO, and AZO. However, the pixel electrode 210 is not limited thereto but may be formed of various materials and may have a structure variously modifiable such as a single layer or a multilayer. The pixel electrode 210, as described above, may include same material as the plurality of conductive layers 140 disposed on the first insulating layer 112 in the peripheral area PA.

A pixel definition layer 120 may be disposed above the first insulating layer 112. The pixel definition layer 120 includes openings corresponding to the pixel electrodes 210, respectively. That is, the pixel definition layer 120 covers edges of the plurality of pixel electrodes 210 and exposes at least at least central portion thereof, respectively, thereby defining pixels. Also, as shown in FIG. 2, the pixel definition layer 120 increases a distance between an end of the pixel electrode 210 and the opposite electrode 230 above the pixel electrode 210, thereby preventing an arc and other undesired effects occurring at the end of the pixel electrode 210. As described above, the pixel definition layer 120 may be formed of an organic material such as polyimide.

In this case, as shown in FIG. 2, the pixel definition layer 120 may be disposed extended from the display area DA of the substrate 100 to the peripheral area PA in a direction toward an outer edge of the substrate 100 (−X direction). In other words, the second insulating layer 120' disposed on the first insulating layer 112 in the peripheral area PA and the pixel definition layer 120 disposed on the first insulating layer 112 in the display area DA may be considered as a single body.

The second insulating layer 120' disposed in the peripheral area PA may be disposed to cover a space 140a between the plurality of conductive layers 140 disposed on the first insulating layer 112. That is, the second insulating layer 120' may be disposed to cover the space 140a between the plurality of conductive layers 140 while exposing at least portions 120a of the plurality of conductive layers 140. Accordingly, at least the portions 120a of the plurality of conductive layers 140, exposed by the second insulating layer 120', become in direct contact with the opposite electrode 230. It will be described below in detail.

On the other hand, as described above, each of the plurality of thin film transistors TFT2 includes the semiconductor layer 203, the gate electrode 205, and the source/drain electrodes 207, on which the second insulating layers 120' may be disposed corresponding to the semiconductor layers 203 of the plurality of thin film transistors TFT2, respectively. In other words, the plurality of thin film transistors TFT2 are disposed below the second insulating layer 120' not to allow the portions 120a, on which the conductive layers 140 are in contact with the opposite electrode 230, to be disposed on the thin film transistor TFT2. That is, the portions 120a of the conductive layers 140, where the conductive layers 140 and the opposite electrode 230 contact each other, do not overlap with the thin film transistors TFT2 in the direction (Z direction) perpendicular to the major surface of the substrate 100. Preferably, the portions 120a of the conductive layers 140, where the conductive layers 140 and the opposite electrode 230 contact each other, do not overlap with the gates 205 of the thin film transistors TFT2 in the direction (Z direction) perpendicular to the major surface of the substrate 100. This is to prevent a damage of the thin film transistor TFT2, caused by heat generated by contact resistances in the portions 120a, on which the conductive layers 140 are in contact with the opposite electrode 230. It will be described below in detail.

As described above, the pixel definition layer 120 considered as forming the single body together with the second insulating layer 120' may define a pixel area and may be disposed in the display area DA of the substrate 100. As described above, the intermediate layer 220 including the emission layer may be disposed on the pixel area defined by the pixel definition layer 120.

The intermediate layer 220 of the OLED 200 may include a low-molecular substance or a high-molecular substance. When including the low-molecular substance, the intermediate layer 220 may be formed as a single or complex structure formed by depositing a hole injection layer (HIL), a hole transport layer (HTL), an emission layer (EML), an electron transport layer (ETL), an electron injection layer (EIL) and others. Various available organic materials such as copper phthalocyanine (CuPc), N, N-Di(naphthalene-1-yl)-N, N'-diphenyl-benzidine (NPB), tris-8-hydroxyquinoline aluminum (Alq3) and others may be used. Such layers may be formed by using vacuum-deposition and others.

When including the high-molecular substance, the intermediate layer 220 may generally have a structure including an HTL and an EML. In this case, polyethylenedioxythiophene (PEDOT) is used as the HTL and the high-molecular substance such as poly-phenylenevinylene (PPV) and polyfluorene is used as the EML, which may be formed by using screen printing, inject printing, laser induced thermal imaging (LITI) and others. However, the intermediate layer 220 is not limited thereto but may have various structures.

The opposite electrode 230 is disposed corresponding to the display area DA and the peripheral area PA outside the display area DA. As shown in FIG. 2, the opposite electrode 230 may be disposed throughout the entire top surface of the display area DA and the peripheral area PA outside the display area DA while covering the second insulating layer 120'. In this case, the opposite electrode 230 disposed in the display area DA is formed as a single body together with the plurality of OLEDs 200, thereby corresponding to the plurality of pixel electrodes 210.

The opposite electrode 230 may be formed as one of a semitransparent electrode and a reflective electrode. When being formed as the semitransparent electrode, the opposite electrode 230 may have a layer formed of metal having a low work function, that is, one of Li, Ca, LiF/Ca, KiF/Al, Ag, Mg, and a compound thereof and a semitransparent conductive layer 140 formed of one of ITO, IZO, ZnO, and $In_2O_3$. When being formed of the reflective electrode, the opposite electrode 230 may have a layer formed of one of Li, Ca, LiF/Ca, LiF/Al, Al, Ag, Mg, and a compound thereof. A configuration and a material of the opposite electrode 230 are not limited thereto and may be variously modified.

As described above, the opposite electrode 230 may be disposed throughout the entire top surface of the display area DA and the peripheral area PA outside the display area DA, in which the opposite electrode 230 disposed in the peripheral area PA may be disposed to be in contact with at least portions of the plurality of conductive layers 140. That is, each of the plurality of conductive layers 140 may be disposed to be in direct contact with the opposite electrode 230 at the portion 120a exposed by the second insulating layer 120'.

In this case, heat is generated due to contact resistances at the portions 120a, on which the plurality of the conductive layers 140 are in direct contact with the opposite electrode 230, in the peripheral area PA. In this case, the thin film transistors TFT2 forming a scan diver of the peripheral area PA are disposed below portions in which the heat is generated by contacts between the plurality of conductive layers 140 and the opposite electrode 230. When being under stress of a high temperature due to the heat, the thin film transistors TFT2 are changed in properties and can not normally operate.

Accordingly, in the apparatus 1, the thin film transistors TFT2 are allowed not to be disposed below the portions 120a on which the plurality of conductive layers 140 are in direct contact with the opposite electrode 230. In other words, the plurality of conductive layers 140 are disposed corresponding to spaces between the thin film transistors TFT2 disposed in the peripheral area PA to prevent the heat of the portions 120a on which the plurality of conductive layers 140 are in direct contact with the opposite electrode 230 from having an effect on the thin film transistors TFT2, thereby not only notably protecting the thin film transistors TFT2 in the peripheral area PA of the apparatus 1 from being damaged but also increasing long-term reliability of the apparatus 1.

Heretofore, the apparatus 1 has been described but is not limited thereto. For example, a method of manufacturing the apparatus 1 will belong to the scope of embodiments of the present invention.

Figure 3:
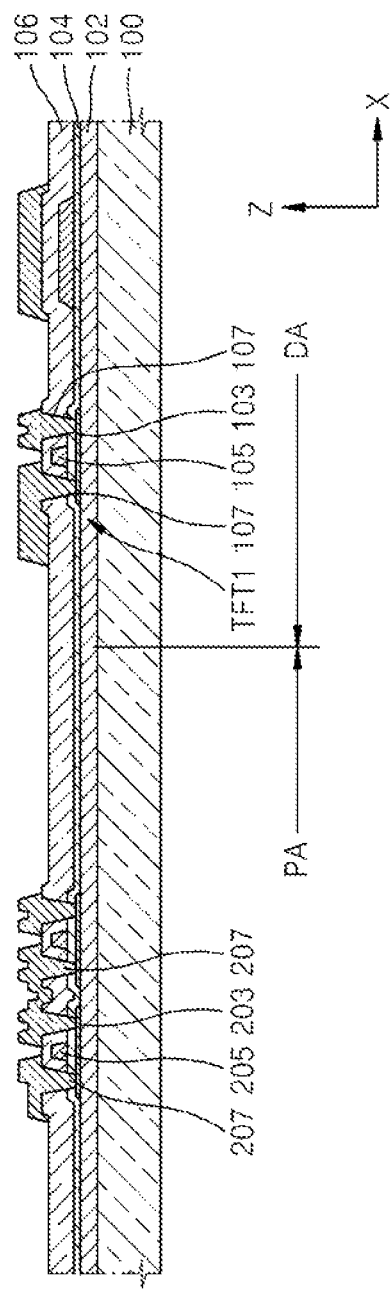
FIGS. 3 to 5 are cross-sectional views illustrating processes of a method of manufacturing the organic light emitting display apparatus according to an embodiment of the present invention.
Figure 4:
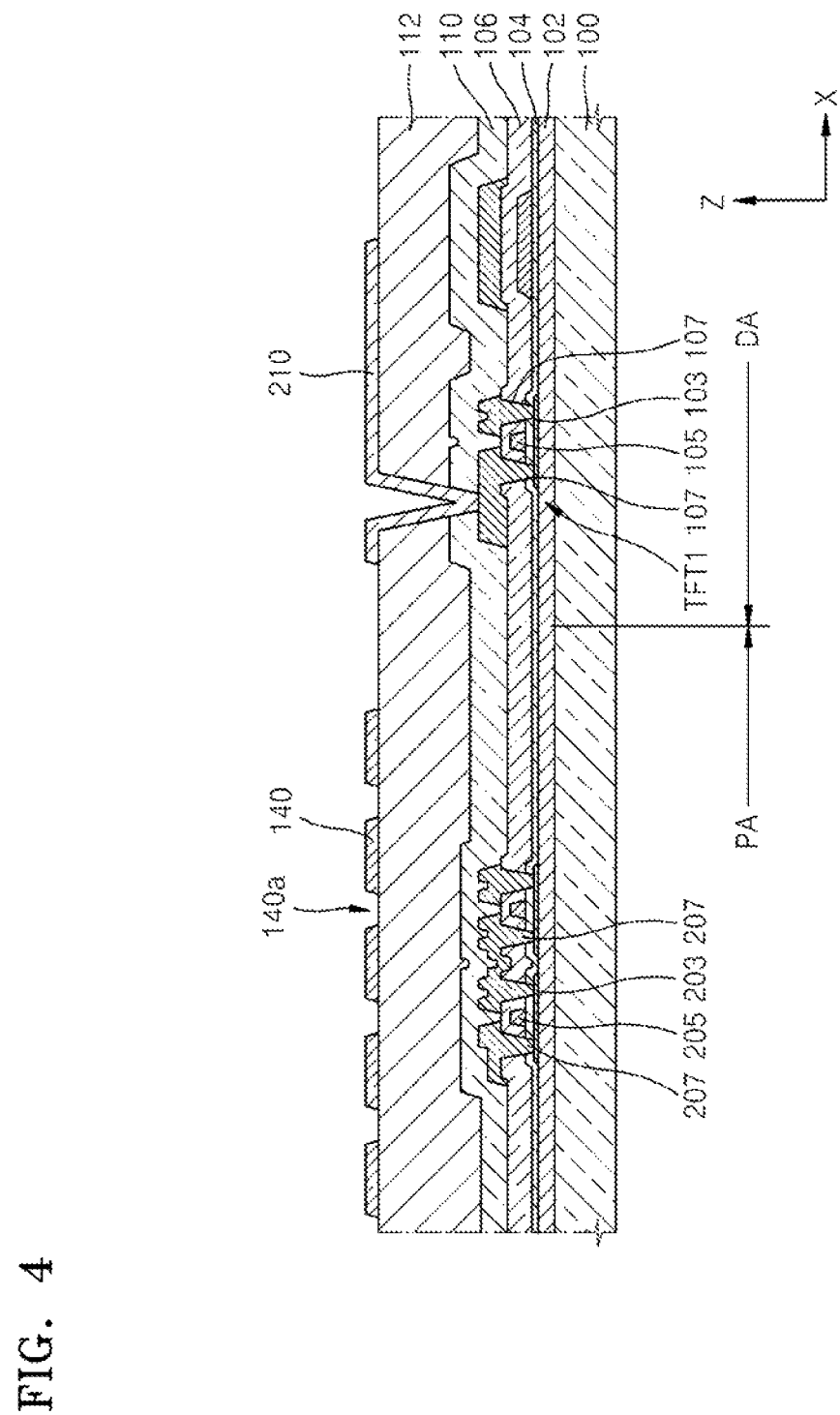
Figure 5:
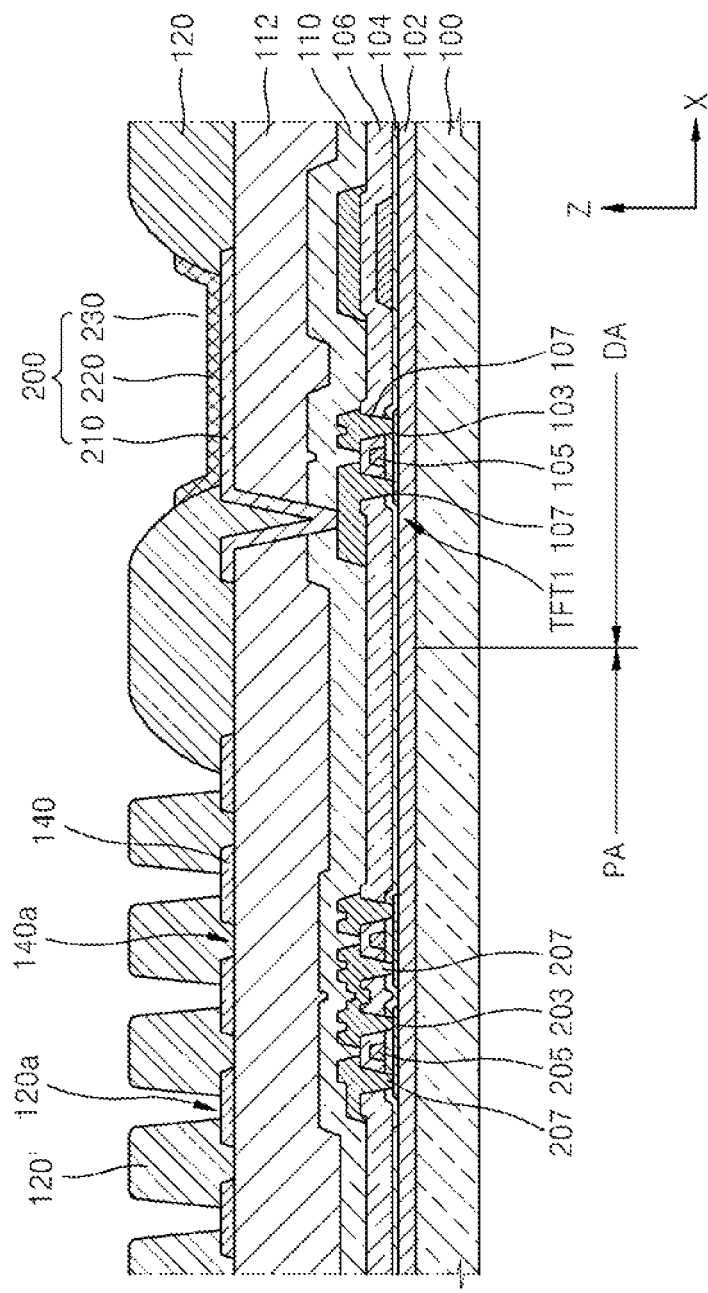

FIGS. 3 to 5 are cross-sectional views illustrating processes of the method of manufacturing the apparatus 1 according to an embodiment of the present invention.

Referring to FIG. 3, the substrate 100 having the display area DA and the peripheral area PA outside the display area DA may be prepared in advance, and the plurality of thin film transistors TFT1 and TFT2 may be formed in the peripheral area PA of the substrate 100.

In this case, the forming of the plurality of the thin film transistors TFT1 and TFT2 may include operations of forming the buffer layer 102 throughout the entire surface of the substrate 100 and then forming the semiconductor layers 103 and 203 on the display area DA and the peripheral area PA of the substrate 100. After that, the gate insulating layer 104 may be formed to cover the semiconductor layers 103 and 203. The gate electrodes 105 and 205 may be formed on the semiconductor layers 103 and 203, the interlayer dielectric 106 may be formed to cover the gate electrodes 105 and 205, and then the source/drain electrodes 107 and 207 may be formed on the gate electrodes 105 and 205. The source/drain electrodes 107 and 207 may be formed to be electrically connected to the semiconductor layers 103 and 203 through the via holes. The source/drain electrodes 207 are shown in FIG. 3 as being connected to each other between the thin film transistors TFT2 disposed in the peripheral area PA, which may be considered to form a wiring of the peripheral area PA. As shown in FIG. 3, the buffer layer 102, the gate insulating layer 104, and the interlayer dielectric 106 may be formed throughout the entire surface of the substrate 100 except the regions where the via holes for making electrical connections are formed.

After that, referring to FIG. 4, the first insulating layer 112 may be formed to cover the plurality of thin film transistors TFT1 and TFT2. The first insulating layer 112 may be formed throughout the entire surface of the display area DA and the peripheral area PA of the substrate 100. Occasionally, as shown in FIG. 4, a protection layer 110 may be further formed throughout the entire surface of the substrate 100 to cover the thin film transistors TFT1 and TFT2 before forming the first insulating layer 112. The first insulating layer 112 and the protection layer 110 are shown in FIG. 4 as single layers but may have multilayer structures and may be variously modified.

In the peripheral area PA outside the display area DA of the substrate 100, the plurality of conductive layers 140 may be formed on the first insulating layer 112 to be located above the plurality of thin film transistors TFT2 while being separated from one another on the first insulating layer 112 to correspond to a space between the plurality of thin film transistors TFT2. A reason of forming the plurality of conductive layers 140 on the first insulating layer 112 to be separated from one another may be understood to allow a lower organic layer to be outgassable.

The forming of the plurality of conductive layers 140 may be performed simultaneously with forming the pixel electrode 210 on the display area DA. That is, the plurality of conductive layers 140 may be formed, while forming the pixel electrode 210 on the display area DA, including the same material.

As described above, simultaneously with forming the plurality of conductive layers 140 in the peripheral area PA of the substrate 100, the plurality of pixel electrodes 210 may be formed on the first insulating layer 112 in the display area DA of the substrate 100. There is an opening in the protection layer 110 and the first insulating layer 112. The opening exposes at least one of the source/drain electrodes 107. The plurality of pixel electrodes 210 each in contact with any one of the source/drain electrodes 107 through the opening and electrically connected to the thin film transistor TFT1 are formed on the first insulating layer 112. The pixel electrodes 210 each may be formed as one of a semitransparent electrode and a reflective electrode.

After that, referring to FIG. 5, the pixel definition layer 120 may be formed on the display area DA of the substrate 100 to cover an edge of each of the plurality of pixel electrodes 210 to expose a central portion of each of the plurality of pixel electrodes 210. In this case, the second insulating layer 120' may be formed in the peripheral area PA to cover the spaces 140a among the plurality of conductive layers 140. The forming of the second insulating layer 120' may be performed simultaneously with forming the pixel definition layer 120.

The second insulating layer 120' formed in the peripheral area PA may be formed to cover the spaces 140a among the plurality of conductive layers 140 formed on the first insulating layer 112. That is, the second insulating layer 120' may be formed to cover the spaces 140a among the plurality of conductive layers 140 while exposing at least the portions 120a of the plurality of conductive layers 140. Accordingly, at least the portions 120a of the plurality of conductive layers 140, exposed by the second insulating layer 120', become in direct contact with the opposite electrode 230. It will be described below in detail.

On the other hand, as described above, the forming of the plurality of thin film transistors TFT2 includes forming the semiconductor layer 203, the gate electrode 205, and the source/drain electrodes 207 of each thereof, in which the second insulating layers 120' may be formed to correspond to the semiconductor layers 203 of the plurality of thin film transistors TFT2, respectively. In other words, the plurality of thin film transistors TFT2 are disposed below the second insulating layer 120', thereby preventing the portions 120a, on which the conductive layers 140 are in contact with the opposite electrode 230, from being located on the thin film transistor TFT2. This is to prevent a damage of the thin film transistor TFT2, caused by heat generated by a contact resistance in the portion 120a, on which the conductive layers 140 are in contact with the opposite electrode 230. It will be described below in detail.

As described above, the pixel definition layer 120 formed simultaneously with forming the second insulating layer 120' may define a pixel area and may be disposed in the display area DA of the substrate 100. The intermediate layer 220 including the emission layer on the plurality of pixel electrodes 210 may be further formed in the pixel area defined by the pixel definition layer 120 as described above.

On the other hand, not shown in FIG. 5, referring to FIG. 2, forming the opposite electrode 230 throughout the entire surface of the substrate 100, corresponding to the display area DA and the peripheral area PA, to cover the second insulating layer 120' and to be in contact with at least portions of the conductive layers 140 may be further included. The forming of the opposite electrode 230 in the display area DA may be performed to allow the opposite electrode 230 to correspond to the plurality of pixel electrodes 210 formed in the display area DA. In this case, the opposite electrode 230 formed in the display area DA may be formed as a single body together with the plurality of OLEDs 200, thereby corresponding to the plurality of pixel electrodes 210.

The opposite electrode 230 may be formed to be in contact with the portion 120a of each of the plurality of conductive layers 140, exposed by the second insulating layer 120', in the peripheral area PA. That is, the opposite electrode 230 may be formed throughout the entire top surface of the display area DA and the peripheral area PA outside the display area DA, in which the opposite electrode 230 disposed in the peripheral area PA may be disposed to be in contact with at least portions 120a of the plurality of conductive layers 140. That is, each of the plurality of conductive layers 140 may be formed to be in direct contact with the opposite electrode 230 at the portion 120a exposed by the second insulating layer 120'.

In this case, the heat is generated due to the contact resistances at the portions 120a, on which the plurality of the opposite electrode 230 are in direct contact with the opposite electrode 230, in the peripheral area PA. In this case, the thin film transistors TFT2 forming the scan diver of the peripheral area PA are disposed below portions in which the heat is generated by contacts between the plurality of conductive layers 140 and the opposite electrode 230. When being under stress of a high temperature due to the heat, the thin film transistors TFT2 are changed in properties and can not normally operate.

Accordingly, in the method of manufacturing the apparatus 1, the thin film transistors TFT2 are allowed not to be formed below the portions 120a, on which the plurality of conductive layers 140 are in direct contact with the opposite electrode 230. In other words, the plurality of conductive layers 140 are formed corresponding to spaces among the thin film transistors TFT2 disposed in the peripheral area PA to prevent the heat of the portions 120a, on which the plurality of conductive layers 140 are in direct contact with the opposite electrode 230, from having an effect on the thin film transistors TFT2, thereby not only notably protecting the thin film transistors TFT2 in the peripheral area PA of the apparatus 1 from being damaged but also increasing long-term reliability of the apparatus 1.

As described above, according to the one or more of the above embodiments of the present invention, there are provided an organic light emitting display apparatus capable of preventing a damage of a driving unit, caused by a heat generation, and a method of manufacturing the apparatus.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light emitting display apparatus, comprising:
    a substrate comprising a display area and a peripheral area outside the display area;
    a plurality of thin film transistors (TFTs) disposed on the peripheral area of the substrate, each of the TFTs including a gate electrode;
    a first insulating layer covering the plurality of TFTs;
    a plurality of conductive layers disposed on the first insulating layer, the conductive layers positioned above the plurality of TFTs, the conductive layers spatially separated from each other forming spaces between two adjacent conductive layers among the plurality of the conductive layers, each of the conductive layers covering a space formed between at least two adjacent TFTs that are disposed below said each of the conductive layers;
    a second insulating layer covering the spaces between two adjacent conductive layers among the plurality of conductive layers; and
    an opposite electrode disposed on the display area and on the peripheral area of the substrate, the opposite electrode covering the second insulating layer, the opposite electrode being in contact with each of the conductive layers, the gate electrode of said each of TFTs overlapping with one of the spaces between two adjacent conductive layers among the plurality of the conductive layers.

2. The apparatus of claim 1, wherein each of the plurality of TFTs comprises a semiconductor layer, a source electrode, and a drain electrode, the second insulating layer disposed to cover the semiconductor layer.

3. The apparatus of claim 1, wherein the second insulating layer is not formed on the portion of said each of the conductive layers on which the opposite electrode directly contacts said each of the conductive layers.

4. The apparatus of claim 1, wherein the first insulating layer is located throughout the display area and the peripheral area of the substrate, the apparatus further comprising:
    a pixel electrode disposed on the first insulating layer in the display area; and
    an intermediate layer disposed on the pixel electrode, the intermediate layer comprising an emission layer, the opposite electrode facing the pixel electrode, the conductive layers comprising the same material as the pixel electrodes.

5. The apparatus of claim 4, further comprising a pixel definition layer covering an edge of the pixel electrode, wherein the second insulating layer is formed as a single body together with the pixel definition layer.

6. A method of manufacturing an organic light emitting display apparatus, the method comprising:
    preparing a substrate comprising a display area and a peripheral area outside the display area;
    forming a plurality of thin film transistors (TFTs) on the peripheral area of the substrate, each of the TFTs including a gate electrode;
    forming a first insulating layer to cover the plurality of TFTs;
    forming a plurality of conductive layers on the first insulating layer to be located above the plurality of TFTs, the conductive layers spatially separated from each other forming spaces between two adjacent conductive layers among the plurality of the conductive layers, each of the conductive layers covering a space formed between at least two adjacent TFTs that are disposed below said each of the conductive layers;
    forming a second insulating layer to cover the spaces between two adjacent conductive layers among the plurality of conductive layers; and
    forming an opposite electrode on the display area and on the peripheral area of the substrate, to cover the second insulating layer, and to be in contact with each of the conductive layers, the gate electrode of said each of TFTs overlapping with one of the spaces between two adjacent conductive layers among the plurality of the conductive layers.

7. The method of claim 6, wherein the forming of the plurality of TFTs comprises:
    forming a semiconductor layer on the peripheral area of the substrate;
    forming the gate electrode on the semiconductor layer; and
    forming a source electrode and a drain electrode on the gate electrode, the second insulating layer formed to cover the semiconductor layer.

8. The method of claim 6, wherein the forming of the second insulating layer comprises exposing a portion of each of the plurality of conductive layers.

9. The method of claim 8, wherein the forming of the opposite electrode comprises forming the opposite electrode to be in contact with the portion of said each of the plurality of conductive layers that is exposed by the second insulating layer.

10. The method of claim 6, wherein the forming of the first insulating layer comprises forming the first insulating layer to be located throughout the display area and the peripheral area of the substrate, the method further comprising:

forming a pixel electrode on the first insulating layer in the display area; and forming an intermediate layer on the pixel electrode, the intermediate layer comprising an emission layer, wherein the forming of the opposite electrode comprises forming the opposite electrode to face the pixel electrode, wherein the forming the plurality of conductive layers is performed simultaneously with the forming the pixel electrodes.

11. The method of claim 10, further comprising forming a pixel definition layer to cover an edge of the pixel electrode to expose a central portion of the pixel electrode, wherein the forming the second insulating layer is performed simultaneously with the forming the pixel definition layer.

* * * * *